United States Patent [19]

Oliver, Jr.

[11] Patent Number: 4,507,157

[45] Date of Patent: Mar. 26, 1985

[54] SIMULTANEOUSLY DOPED LIGHT-EMITTING DIODE FORMED BY LIQUID PHASE EPITAXY

[75] Inventor: James D. Oliver, Jr., Charlottesville, Va.

[73] Assignee: General Electric Company, Syracuse, N.Y.

[21] Appl. No.: 578,392

[22] Filed: Feb. 9, 1984

Related U.S. Application Data

[62] Division of Ser. No. 261,584, May 7, 1981, abandoned.

[51] Int. Cl.³ .......................................... H01L 21/208
[52] U.S. Cl. .................................. 148/171; 29/569 L;
  29/576 E; 148/172; 148/173
[58] Field of Search ............... 148/171, 173, 175, 185,
  148/172; 29/569 L, 576 E

[56] References Cited

U.S. PATENT DOCUMENTS

| | | | |
|---|---|---|---|
| 3,752,713 | 8/1973 | Sakuta et al. | 148/171 |
| 3,755,013 | 8/1973 | Hollan | 148/172 |
| 3,773,571 | 11/1973 | Rupprecht et al. | 148/172 |
| 4,052,252 | 10/1977 | Lockwood et al. | 156/622 |
| 4,055,443 | 10/1977 | Akimov et al. | 148/1.5 |
| 4,131,904 | 12/1978 | Ladany | 357/17 |

FOREIGN PATENT DOCUMENTS 1149109  4/1969  United Kingdom ............... 148/171

Primary Examiner—G. Ozaki
Attorney, Agent, or Firm—Robert J. Mooney

[57] ABSTRACT

A light emitting diode and a method for the manufacture thereof is described. The diode may be formed by liquid phase epitaxial growth from a single melt including p and n conductivity type dopants. The p conductivity type layer grows first followed by the n conductivity layer.

1 Claim, 2 Drawing Figures

SIMULTANEOUSLY DOPED LIGHT-EMITTING DIODE FORMED BY LIQUID PHASE EPITAXY

This application is a division of application Ser. No. 261,584, filed May 7, 1981, now abandoned.

This invention relates in general to semiconductor devices and particularly to a light-emitting semiconductor diode and a method for the manufacture thereof wherein a p-n junction structure is formed in a single step by introducing the donor and acceptor impurities into a single melt and then forming the device by liquid epitaxial growth on a substrate from the melt so as to sequentially produce first a p-type and then an n-type layer through control of the temperature of growth and concentration of dopants.

BRIEF DESCRIPTION OF THE PRIOR ART

For some time, relatively high performance light-emitting diodes have been manufactured by amphoteric silicon-doping of gallium-arsenide. The high level of performance achieved in devices of this type results from several factors including the high internal radiative efficiency of the p-n junction as well as the low internal absorption losses. In direct-band-gap materials like gallium-arsenide, low absorption can be realized only if the photon energy is substantially less than the band-gap energy of the material through which the photons must pass. This condition is partially met in silicon-doped gallium-arsenide because the radiative recombination process which determines the photon energy involves transitions between acceptor states far removed from the valance band transitions to which are primarily responsible for absorption. These conditions also result in the relatively greater absorption of photons that pass into the p-type portion of the device as compared to photons passing through the n-type portion. Absorption is greater in the p-type layer since the energy of absorption therein as influenced by the silicon dopant is lower than the energy of photons generated on the n side of the junction.

While silicon-doped gallium-arsenide has for some time provided high performance light-emitting diodes and has consequently been widely used, more recently other materials have been discovered which offer further advantages. For example, silicon-doped gallium-aluminum arsenide provides devices superior to those made from silicon-doped gallium-arsenide in several respects. First, the energy and thus the wavelength of the emitted photons can be varied to match the maximum response wavelength of the detector by varying the amount of aluminum in the device. This is especially important where the emitter is utilized in a system employing a silicon detector. The absorption coefficient for silicon is strongly dependent upon the photon energy in the range of about 1.0 to 2.0 electron volts. The fraction of photons absorbed by a silicon detector may be increased by increasing the thickness of the detector. However, for silicon detectors of reasonable thickness, 1.31 electron volt photons such as are produced by silicon-doped gallium-arsenide light-emitting diodes, are inefficiently absorbed. Even relatively modest increases in photon energy such as are achievable through the use of silicon-doped gallium-aluminum-arsenide light-emitting diodes produce significant increases in compatability between the emitter and a silicon detector. Second, a graded band-gap structure which even further enhances the transmission of photons through the n-type layer may be realized. This is achieved because of the variation in the amount of aluminum incorporated in the device during the growth of the thick epitaxial layers. The aluminum concentration decreases substantially as growth proceeds due to the depletion of aluminum from the bulk of the liquid melt very near the interface with the substrate and slow diffusion into this region. Consequently, the band gap decreases in the direction of the last to form the p-conductivity layer thereby enhancing transmission of photons through the n-type layer.

Although silicon-doped gallium-aluminum arsenide light-emitting diodes have provided significant advantages over prior art devices such as silicon-doped gallium-arsenide light-emitting diodes, they are not without disadvantages. For example, the nature of the process heretofore used for forming such devices inherently produces a structure in which the n-type gallium-aluminum arsenide layer grows first followed by the growth of the p-type layer. The reason for this is the amphoteric nature of silicon as a dopant in gallium-aluminum arsenide as well as the particular temperature dependence of the distribution coefficient thereof. The distribution coefficient of silicon as an acceptor is relatively constant with temperature at least in the range of temperatures employed for liquid phase epitaxial growth of gallium-aluminum arsenide material. The distribution coefficient of silicon as a donor decreases with decreasing temperature and therefore a gallium-aluminum-arsenide structure including a p-n junction therein may be grown from a single source of liquid gallium-aluminum arsenide and silicon by decreasing the temperature during the growth cycle. At the melting point of gallium arsenide, approximately 1235° C., silicon acts primarily as a donor and n-type gallium-aluminum arsenide material may be formed by epitaxial growth. As the growth process proceeds and the temperature is decreased, the distribution coefficient of silicon as a donor also decreases and at an intermediate point in the process where the distribution coefficient of silicon as an acceptor exceeds and continues to exceed, by greater and greater amounts, with decreasing temperatures, the distribution coefficient of silicon as a donor, p-type material is formed. The structure thus produced includes a substrate which is generally thicker than the epitaxial layers grown thereon, an n-type layer having a thickness dependent upon the conditions of growth and particularly upon the length of time during which the growth is carried out at a relatively high temperature but which is typically on the order of 100 micrometers; and a p-type layer overlying the n-type layer and having a thickness on the same order. Further, as has been described, the concentration of aluminum is greatest at the interface between the n-type layer and the substrate and may be reduced virtually to zero at the opposite surface of the p-type layer where growth is halted. Since, for the reasons herein above discussed, light is not emitted in substantial amount through the major surface of the p-type layer, the first step in processing the material is the removal of the substrate from the epitaxial layer. Typically, the substrate may be etched or lapped or polished away leaving only the epitaxially grown portion of the structure. Since there is a substantial gradient of aluminum concentration in the epitaxial portion it is a disadvantage of devices grown as described that high residual stress is present therein which causes bending of the wafer which greatly increases the difficulty both of forming contacts thereon as well as of mounting the wafers for further processing. Especially where relatively thin epitaxial structures are desired, as are preferable for obtaining the greatest light output therefrom, this bowing is so severe as to substantially prevent their use, thus making relatively thick and therefore undesirable structures necessary. Still further, even if the bowing of device were overcome, the removal of the substrate is an undesirable step inasmuch as it adds complexity and cost to the process as well as reducing the yield thereof both of which are undesirable. Further, since a single amphoteric dopant is employed which has a fixed crossover point at which the donor-acceptor nature of the dopant changes, liquid phase epitaxial growth must be carried out at temperatures which include that crossover temperature. In general, higher growth temperatures result in greater numbers of lattice defects which are detrimental to achieving the highest possible light output from the device. Still further, since the distribution coefficient of silicon in gallium arsenide and gallium-aluminum arsenide changes relatively gradually with temperature, the concentration gradient of the finished device is relatively shallow resulting in low surface carrier concentration thereby increasing the difficulty of applying contacts thereto.

SUMMARY OF THE INVENTION

Accordingly, it is an object of this invention to provide a semiconductor light-emitting diode formed by liquid epitaxial growth from a single melt first of a p-type and then of an n-type semiconductor layer without need for interrupting the process.

It is another object of this invention to provide a semiconductor light-emitting diode which may be utilized without removal of the substrate on which it is formed thus allowing thinner epitaxial layers to be employed.

It is still another object of this invention to provide a gallium-aluminum arsenide semiconductor light-emitting diode having a more constant aluminum concentration than has been heretofore possible.

It is yet another object of this invention to provide a semiconductor light-emitting diode according to a process which allows the junction abruptness to be increased without substantially increasing the cooling rate in accordance with an epitaxial growth process.

It is a further object of this invention to provide a method for forming a gallium-aluminum arsenide semiconductor light-emitting diode at lower temperature than have heretofore been possible.

It is still a further object of this invention to provide a gallium-aluminum arsenide light-emitting diode which is less susceptible to warping than has been heretofore possible.

Briefly stated and in accordance with a presently preferred embodiment of this invention, a semiconductor light-emitting diode is provided having a unitary epitaxially grown single crystal layer including a p-conductivity type region essentially comprised of gallium arsenide and including therein a conductivity determining impurity, for example germanium, having a distribution coefficient which increases with increasing temperature and an n-conductivity type region adjacent to said p-conductivity type region and forming a first p-n junction therewith, the n-conductivity type region including a conductivity determining impurity, preferably tellurium, which has a distribution coefficient which increases with decreasing temperature.

The invention also includes a method for forming a semiconductor light-emitting diode in accordance with the above which comprises providing a suitable substrate such as a gallium arsenide or gallium aluminum arsenide substrate and epitaxially growing thereon, from a single melt, a unitary single crystal semiconductor layer including first and second regions of p-conductivity type and n-conductivity type respectively. Both conductivity determining impurities, for example, germanium and tellurium are simultaneously present in the melt, the conductivity type of the region epitaxially grown from the melt at a particular stage of the process being determined by the temperature at which growth occurs. By commencing epitaxial growth on the substrate at a relatively high temperature and decreasing the temperature of the melt during growth a layer including first a p-type and then an n-type region is grown.

In accordance with a presently preferred embodiment of the invention the epitaxial growth processes hereinabove described are commenced on a p-conductivity type substrate, the p-type diode region being first grown followed by the n-type region. This structure does not require the removal of the substrate for operation since emission is primarily from the n-conductivity type region, and contact to the p-type region can be made through the p-type substrate since no junction is formed therebetween. Since the substrate provides resistance to bending, thinner epitaxial layers may be utilized without warping of the device due to differing lattice constants.

BRIEF DESCRIPTION OF THE FIGURES

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

DETAILED DESCRIPTION

Figure 1:
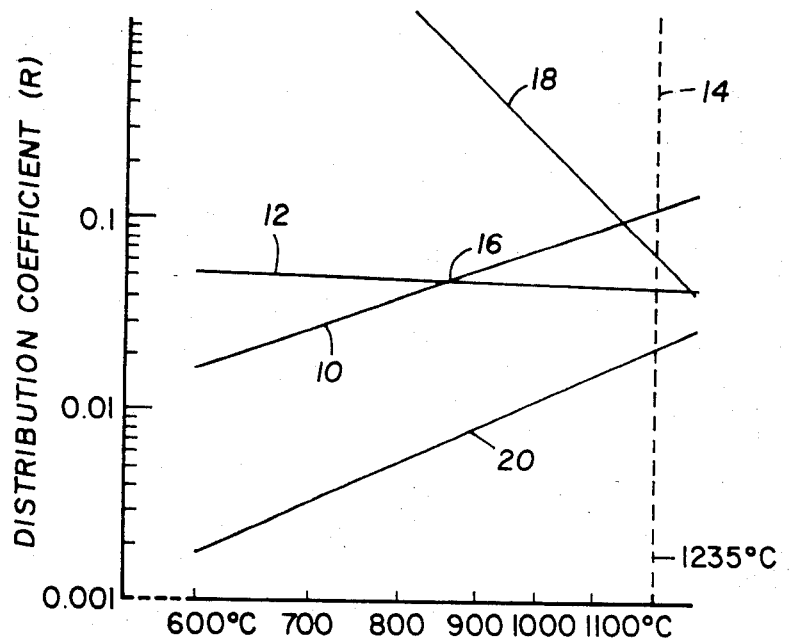
FIG. 1 is a graphical representation of the distribution coefficients of silicon, both as a donor and as an acceptor, germanium and tellurium all as a function of temperature.

Referring now to FIG. 1 the distribution coefficients as a function of temperature for silicon, germanium and tellurium are shown. Curves 10 and 12 represent the distribution coefficients for silicon as a donor and as an acceptor respectively. Conventionally, epitaxially grown silicon-doped gallium arsenide devices are made by heating the substrate and the melt to a temperature of about 600° C. as illustrated by dotted line 14, contacting the melt including a few percent of silicon with the substrate and cooling the assembly to a temperature below crossover point 16 where the distribution coefficient silicon as an acceptor begins to exceed the distribution coefficient of silicon as a donor. Consequently, the first grown layer is n-type and the latter grown layer is p-type. The distribution coefficient as a function of temperature for tellurium and germanium are illustrated by curves 18 and 20 respectively. It will be noted initially that the distribution coefficients have an opposite temperature dependence compared to those of silicon for donors and acceptors respectively. The distribution coefficient of tellurium decreases with increasing temperature while the distribution coefficient of germanium increases with increasing temperature. This permits in a normal, decreasing temperature, epitaxial growth process in accordance with this invention, the sequential formation on a gallium arsenide substrate of first a p-conductivity type region and then an overlying n-conductivity type region in a single crystal epitaxially grown layer which structure is particularly advantageous for reasons hereinabove discussed.

Figure 2:
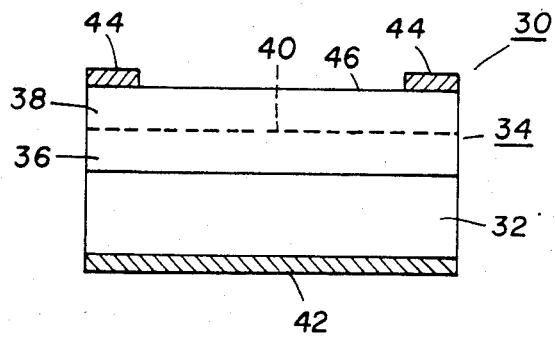
FIG. 2 is a section view of a semiconductor light-emitting diode in accordance with a presently preferred embodiment of this invention.

FIG. 2 is a generalized view of a light-emitting semiconductor diode in accordance with a presently preferred embodiment of this invention. The diode indicated generally at 30 includes a p-conductivity type substrate 32 having epitaxially grown thereon a layer 34 including a p-type region 36, an n-type region 38 and a junction 40 therebetween which although illustrated herein by a dotted line will be recognized by those skilled in the art to be a graded junction. A first contact 42 covering the bottom surface of substrate 32 and a second contact 44 overlying a portion of upper surface 46 of layer 34 are provided. Since light is emitted from device 30 primarily through surface 46, it is desirable for electrode 44 to cover only a portion thereof and the electrode may therefore have the form of a peripheral annularly-shaped electrode, a plurality of fingers, a central contact or the like, all of which electrode structures are per se known to those skilled in the art.

The manufacture of a semiconductor light-emitting diode in accordance with this invention commences with the preparation of a gallium-arsenide substrate which is a p-conductivity type substrate so as to permit ohmic electrical connection to the epitaxially grown light-emitting diode without removal of the substrate. The preparation of semiconductor substrates for epitaxial growth thereon is per se well known. Preferably the substrate is oriented to present the 100 surface for growth thereon, the surface being polished and then cleaned in an organic solvent such as acetone, perchlorethelene, trichlorethelene, methanol or the like. The substrate is then etched in a solution of sulphuric acid, hydrogen peroxide and water, or other polishing etch which may be a non-preferential polishing etch.

The thus prepared substrates are loaded into a suitable fixture such as a graphite sliding or rotating boat which allows the substrate and the melt to be brought to an equilibrium temperature separately and then brought into contact. Generally equilibrium may be reached within about one half hour to a few hours depending upon the furnace employed and the amount of material present, especially in the melt. It is preferred in accordance with this invention to perform the epitaxial growth in a closely controlled atmosphere especially where gallium-aluminum arsenide layers are grown. It is desirable to minimize the amount of $O_2$ and $H_2O$ in the tube to prevent the oxidation of the melt which may result in poor growth. Preferably an atmosphere including a combination of hydrogen and nitrogen is employed to provide a suitable non-explosive reducing atmosphere.

The melt includes primarily gallium and arsenic along with a lesser amount of aluminum where gallium-aluminum arsenide devices are desired. First and second conductivity determining impurities are also added to the melt. A p-conductivity type establishing impurity is selected which is characterized by a distribution coefficient which increases with increasing temperature and an n-conductivity type establishing impurity is selected which is characterized by a distribution coefficient which decreases with increasing temperature. It is preferred in accordance with this invention to use germanium as the p-conductivity type establishing impurity and tellurium as the n-conductivity type establishing impurity. It will be recognized by those skilled in the art that other impurities with the required characteristics especially as to distribution coefficient and other characteristics which are significant in selecting impurities for semiconductor doping are suitable. For example, selenium may be employed in place of tellurium as the n-conductivity type determining impurity. The distribution coefficient of selenium is characterized by the same relative temperature dependent as tellurium but is in fact higher in an absolute sense and a lesser concentration of selenium would therefore be indicated. For purposes of illustrating the invention and since they represent what is presently thought to be the best mode for the practice thereof, germanium and tellurium will be utilized as the conductivity establishing impurities in the embodiment of the invention to be described. The concentration of germanium and tellurium in the melt is adjusted to provide the desired transition temperature between p-type and n-type epitaxial growth in the range of temperatures at which growth is carried out. For example, in order to decrease the temperature at which the transition from p-type to n-type material occurs, the ratio of germanium to tellurium is increased. Similarly, to increase the temperature at which the transition occurs the ratio of tellurium to germanium is increased. It will be seen, therefore, that the invention allows great flexibility in establishing the thicknesses of the p-type and n-type portions of the epitaxially grown layer independently of each other as well as independently of the range of temperatures over which epitaxial growth is carried out. Still further, by changing the rate of cooling during growth, yet another degree of control over the thicknesses of the p and n type regions is provided. The flexibility of the growth process in accordance with this invention represents a substantial improvement over that achievement using the amphoteric silicon doping of the prior art in which the temperature at which the nature of silicon changes from donor to acceptor is fixed at about 860° C. It will be seen, therefore, that the advantage of using a single melt which greatly simplifies the process of growing the epitaxial layer is retained while the ability to grow a structure having a preferred p-conductivity type initial growth and n-conductivity type final growth is achieved.

A wide range of cooling rates may be utilized in accordance with this invention, for example, from about 0.01 to 10 degrees per minute. Further either linear or nonlinear cooling rates may be employed as is desired. It is an advantageous aspect of this invention that the junction abruptness may be modified by changing the growth temperature and/or cooling rate because the donor and acceptor distribution coefficients change in different manners with temperature. While sharper junctions are not necessarily preferred, the ability to achieve a junction of equivalent sharpness as is obtained with amphoteric silicon but with a slower growth rate and lower growth temperature provides a structure having fewer defects which adversely reduce the light output of the device.

After the desired amount of growth of the epitaxial layer including both the p-type and n-type regions thereof has been completed, the melt is preferably removed, for example, by sliding from the epitaxial layer grown on the substrate and the device is cooled. Contacts 42 and 44 are then applied to the device by polishing surface 46 and evaporating suitable metal contacts onto the surface as is well known to those skilled in the art. The contacts may be patterned by conventional means which will not be discussed herein. Contact 42 may be applied directly to the lower surface of substrate 32 or the substrate may be wholly or partially removed as for example, by polishing or lapping prior to contact application. Where the substrate is wholly removed the contact is applied directly to the lower surface of region 36 of epitaxially grown layer 34. The choice of contact material is not particularly complicated through the use of this invention and, for example, germanium-gold alloy, aluminum-germanium-gold, tin-gold, or the like may be utilized to contact the n-conductivity type side of the device while platinum or platinum-gold may be utilized on the p-side.

It is preferred in accordance with this invention that where gallium-aluminum arsenide is employed, the aluminum concentration is not substantially decreased as growth progresses. A decreasing aluminum profile causes increased absorption of photons as they are emitted from the neighborhood of the junction and pass through the n-type region. The process for manufacturing gallium-aluminum arsenide light-emitting diodes in accordance with this invention provides an increasing aluminum concentration where aluminum is present in the melt since the distribution coefficient of aluminum increases with decreasing temperature thereby causing the concentration of aluminum to increase as growth progresses if sufficient aluminum is present in the melt to eliminate any decreasing concentration due to depletion of the melt.

The gallium-aluminum arsenide light-emitting diode of this invention differs in still another way from somewhat similar devices of the prior art. For example, while germanium and tellurium have been used for forming gallium-arsenide light-emitting diodes in the past, they have been employed in separate melts which have been sequentially brought into contact with the wafer during growth. This unnecessarily and undesirably increases the complexity of the manufacturing operation and further introduces the possibility for a layer of defects to be created at the junction where epitaxial growth is necessarily halted and recommenced as melts containing the different required impurities are brought into contact therewith. In accordance with this invention wherein a single melt including two conductivity determining impurities having distribution coefficients which vary in opposite directions as a function of temperature are provided, a single epitaxial layer is grown including two regions, a first region which is predominately p-type and a second region which is predominately n-type but each of which regions includes to some extent impurities which would tend to impart the opposite conductivity type. For example, where germanium and tellurium are employed the first grown p-conductivity type region of layer 34 has its conductivity primarily determined by the presence of germanium impurity atoms therein although a much smaller concentration of tellurium impurity is also present. As the growth temperature decreases the concentration of germanium decreases while the concentration of tellurium increases and at the junction further growth is dominated by the effect of tellurium impurity and n-type conductivity is imparted to the layer. Even in the n-conductivity type region 38, however, germanium atoms are present in decreasing concentration as growth proceeds but the ratio of tellurium to germanium impurity is such that the n-conductivity type is imparted to the region.

A gallium-aluminum arsenide light-emitting diode including conductivity determining impurities such as selenium, germanium and tellurium has been described which exhibits a number of improvements over prior art devices. Although a non-amphoteric double dopant is employed, the impurities are introduced in a single melt thus eliminating any increase in complexity of the growth process. A degree of control over junction grading unrealizable with amphoteric dopants is provided. As an acceptor, germanium is felt to be preferable to silicon since it is a deeper level impurity and less emitted light will be absorbed by the emmiter itself as well as allowing a constant or slightly decreasing band gap in gallium-aluminum arsenide. A substantially reduced growth temperature may be employed in accordance with this invention which substantially reduces defects in the epitaxially grown layer and enhances efficiency. Since the substrate is of p-type, it need not be removed prior to contact formation. The majority of emission is through the n-region of the epitaxial layer and substantially thinner n and p type regions may be provided thus reducing absorption and increasing efficiency. Since the number of processing steps following the epitaxial growth step is reduced due to the elimination of the substrate removal, fewer induced defects will be present in the active portion of the device thereby still further increasing efficiency.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for making a gallium arsenide semiconductor light emitting diode, comprising
    (a) providing a p-conductivity type substrate;
    (b) providing a gallium arsenide melt including germanium for establishing p-conductivity and having a distribution co-efficient which increases with increasing temperature and tellurium for establishing n-conductivity and having a distribution co-efficient which decreases with increasing temperature;
    (c) adjusting the concentration of germanium and tellurium in said melt;
    (d) heating said substrate and said melt to a temperature in excess of 860° C.;
    (e) contacting said substrate and said melt; and
    (f) decreasing said temperature at a controlled rate to below 400° C., to epitaxially grow an initial p-conductivity type layer of a desired thickness on said substrate in accordance with the concentration of germanium in said melt and a subsequent n-conductivity type layer of a desired thickness on said p-conductivity type layer in accordance with the concentration of tellurium in said melt.

* * * * *